(12) United States Patent
Liu

(10) Patent No.: US 10,686,029 B1
(45) Date of Patent: Jun. 16, 2020

(54) METHOD FOR REPAIRING DISCONNECTING SIGNAL LINE OF THIN FILM TRANSISTOR (TFT) ARRAY SUBSTRATE

(71) Applicant: Shenzhen China Star Optoelectronics Semiconductor Display Technology Co., Ltd., Shenzhen (CN)

(72) Inventor: Zhaosong Liu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/331,157

(22) PCT Filed: Nov. 27, 2018

(86) PCT No.: PCT/CN2018/117577
§ 371 (c)(1),
(2) Date: Mar. 7, 2019

(87) PCT Pub. No.: WO2020/077742
PCT Pub. Date: Apr. 23, 2020

(30) Foreign Application Priority Data

Oct. 15, 2018 (CN) .......................... 2018 1 1193754

(51) Int. Cl.
*H01L 27/32* (2006.01)

(52) U.S. Cl.
CPC .... *H01L 27/3276* (2013.01); *H01L 2227/323* (2013.01)

(58) Field of Classification Search
None
See application file for complete search history.

(56) References Cited

U.S. PATENT DOCUMENTS

| 9,444,443 | B2 * | 9/2016 | Chung | G09G 3/3677 |
| 2004/0016925 | A1 * | 1/2004 | Watamura | G02F 1/136259 257/59 |
| 2016/0187750 | A1 * | 6/2016 | Tang | G02F 1/136259 349/42 |
| 2018/0294291 | A1 * | 10/2018 | Wei | H01L 27/1262 |
| 2019/0004382 | A1 * | 1/2019 | Ren | H01L 27/3276 |

* cited by examiner

*Primary Examiner* — J. E. Schoenholtz

(57) ABSTRACT

A method for repairing a disconnecting signal line of a thin film transistor (TFT) array substrate including: providing a TFT array substrate with a disconnecting signal line; defining a through hole at an edge of an overlapping area of the repairing line and the disconnecting signal line; printing ink in the through hole, the ink completely covers the through hole, the ink contains a plurality of metal nanoparticles; and curing the ink to make the repairing line and the disconnecting signal line to be connected.

10 Claims, 2 Drawing Sheets

METHOD FOR REPAIRING DISCONNECTING SIGNAL LINE OF THIN FILM TRANSISTOR (TFT) ARRAY SUBSTRATE

RELATED APPLICATIONS

This application is a National Phase of PCT Patent Application No. PCT/CN2018/117577 having International filing date of Nov. 27, 2018, which claims the benefit of priority of Chinese Patent Application No. 201811193754.8 filed on Oct. 15, 2018. The contents of the above applications are all incorporated by reference as if fully set forth herein in their entirety.

FIELD AND BACKGROUND OF THE INVENTION

The present invention relates to the field of display technology, and particularly to a method for repairing a disconnecting signal line of a TFT array substrate.

In the present AMOLED (Active Matrix Organic Light Emitting Diode) display, signal lines are mainly used to provide video signals to drive pixel circuits, but during the manufacturing process, due to affected by up and down fluctuations, environmental particles, etching processes, etc. of the substrate surface, disconnecting signal lines are easy occurred in the signal lines, to lead a number of line defects. Moreover, as a size of the AMOLED panel increased and the resolution increased, a number of signal lines are designed, a narrower line width is requested, it is a more difficult process and more chance to cause a disconnecting signal line, and ultimately a product yield and production costs are impacted.

The present method for repairing disconnecting signal lines of the signal lines is usually to introduce repairing lines. Signals of the repairing line are provided by the driver chip circuit. The repairing lines are interleaved with the signal lines, and the insulating layer is formed between the repairing lines and the signal lines, when the signal lines are broken, the signal lines and the repairing lines are melted by a laser process to make the signals provided from the repair lines to the disconnecting signal lines and to eliminating the influence of display failure caused by the disconnecting signal lines. However, it is difficult to control a process of melting the insulating layer formed between the signal lines and the repairing lines to make them to be connected by the laser process, a exceeding melting will cause a whole area pierced, an insufficient melting will be not able to connect the repairing lines to the signal lines, and finally the repairing effect is affected.

Above all, the present the method for repairing the disconnecting signal lines of the TFT array substrate, the signal lines and the repairing lines are melted by a laser process, the exceeding melting will cause the whole area pierced, the insufficient melting will be not able to connect the repairing lines to the signal lines to affect the disconnecting signal line repairing effect, further to impact on the display effect of the display screen.

The present method for repairing the disconnecting signal lines of the TFT array substrate, during melting the signal lines and the repairing lines by a laser process, the exceeding melting will cause the whole area pierced, the insufficient melting will be not able to connect the repairing lines to the signal lines to affect the disconnecting signal line repairing effect, further to impact on the display effect of the display screen.

SUMMARY OF THE INVENTION

The present application provides a method for repairing a disconnecting signal line of a thin film transistor (TFT) array substrate for improving a method for repairing a disconnecting signal line of the large-scale OLED display panel, to solve the present method for repairing the disconnecting signal line of the TFT array substrate, during melting the signal lines and the repairing lines by a laser process, the exceeding melting will cause the whole area pierced, the insufficient melting will be not able to connect the repairing lines to the signal lines to affect the disconnecting signal line repairing effect, further to impact on the display effect of the display screen.

To solve the above problem, the present invention provides the technical scheme as follows:

The present application provides a method for repairing a disconnecting signal line of a thin film transistor (TFT) array substrate, including:

a step S10 of providing a TFT array substrate, wherein the TFT array substrate includes a disconnecting signal line, the TFT array substrate includes a base, a plurality of signal lines formed on the base, a first insulating layer covering the base and the signal lines, a plurality of repairing lines formed on the first insulating layer, and a second insulating layer covering the first layer and the repairing line;

a step S20 of defining a through hole in the first insulating layer placed at an edge of an overlapping area of the repairing line and the disconnecting signal line;

a step S30 of printing ink in the through hole by an inkjet printing, wherein the ink completely covers the through hole, the ink includes a plurality of metal nanoparticles; and a step S40 of curing the ink to make the repairing line and the disconnecting signal line to be connected.

The method for repairing the disconnecting signal line of the TFT array substrate of one embodiment of the present disclosure, in the step S20, the through hole is defined by a laser drilling process.

The method for repairing the disconnecting signal line of the TFT array substrate of one embodiment of the present disclosure, the through hole passes through the second insulating layer and the first insulating layer and ends at the disconnecting signal line.

The method for repairing the disconnecting signal line of the TFT array substrate of one embodiment of the present disclosure, in the step S30, the metal nanoparticles are made of silver.

The method for repairing the disconnecting signal line of the TFT array substrate of one embodiment of the present disclosure, the step S40, the metal nanoparticles are heated in the curing process.

The method for repairing the disconnecting signal line of the TFT array substrate of one embodiment of the present disclosure, in the step S10, the repairing line is made of tungsten or molybdenum.

The method for repairing the disconnecting signal line of the TFT array substrate of one embodiment of the present disclosure, the first insulating layer is made of one or a combination of silicon oxide and silicon nitride, the second insulating layer and the first insulating layer are made by a same material.

The method for repairing the disconnecting signal line of the TFT array substrate of one embodiment of the present disclosure, a thickness of the second insulating layer is greater than a thickness of the first insulating layer.

The method for repairing the disconnecting signal line of the TFT array substrate of one embodiment of the present disclosure, the signal line is made of one or a combination of molybdenum and tungsten.

The method for repairing the disconnecting signal line of the TFT array substrate of one embodiment of the present disclosure, the signal lines include a plurality of data lines and a plurality of gate electrode lines.

The advantages of the present application are: in the method for repairing the disconnecting signal line of the TFT array substrate, the insulating layer placed at edge of the disconnecting signal lines is melted, and filled with the solidified metal nanoparticles to realize a connection between the disconnecting signal line and the repairing lines and to improve a repairing effect of the disconnecting signal line and to improve a repairing yield.

BRIEF DESCRIPTION OF THE SEVERAL VIEWS OF THE DRAWINGS

In order to explain more clearly the embodiments in the present application or the technical solutions in the prior art, the following will briefly introduce the figures needed in the description of the embodiments or the prior art. Obviously, figures in the following description are only some embodiments of the present application, and for an ordinary person skilled in the art, other figures may also be obtained based on these figures without paying creative efforts.

DESCRIPTION OF SPECIFIC EMBODIMENTS OF THE INVENTION

Figure 1:
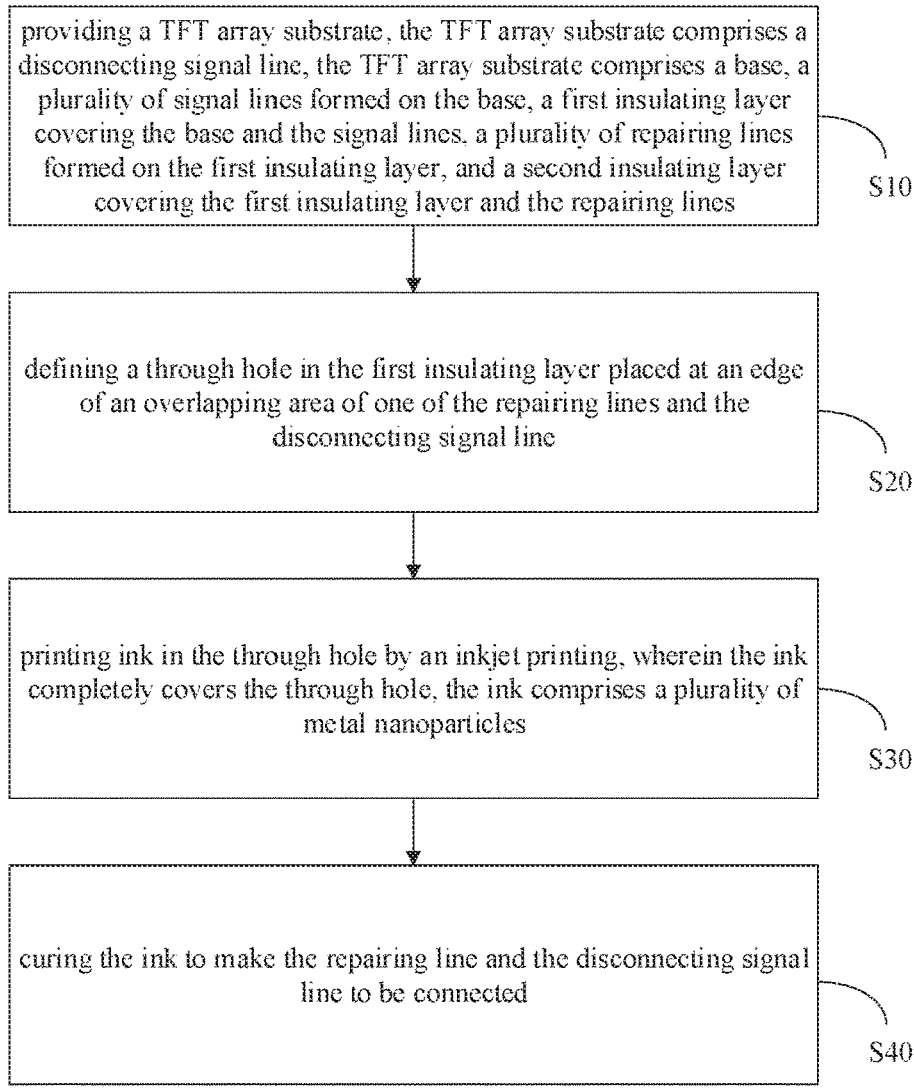
FIG. 1 is a flow chart of a method for repairing a disconnecting signal line of a TFT array substrate of the present disclosure.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

The present disclosure is directed to a technology problem of a method for repairing a disconnecting signal line of a TFT array substrate in prior art, during melting the signal lines and the repairing lines by a laser process, the exceeding melting will cause the whole area pierced, the insufficient melting will be not able to connect the repairing lines to the signal lines to affect the disconnecting signal line repairing effect, further to impact on the display effect of the display screen, the present disclosure can solve the above defects.

Figure 2A:
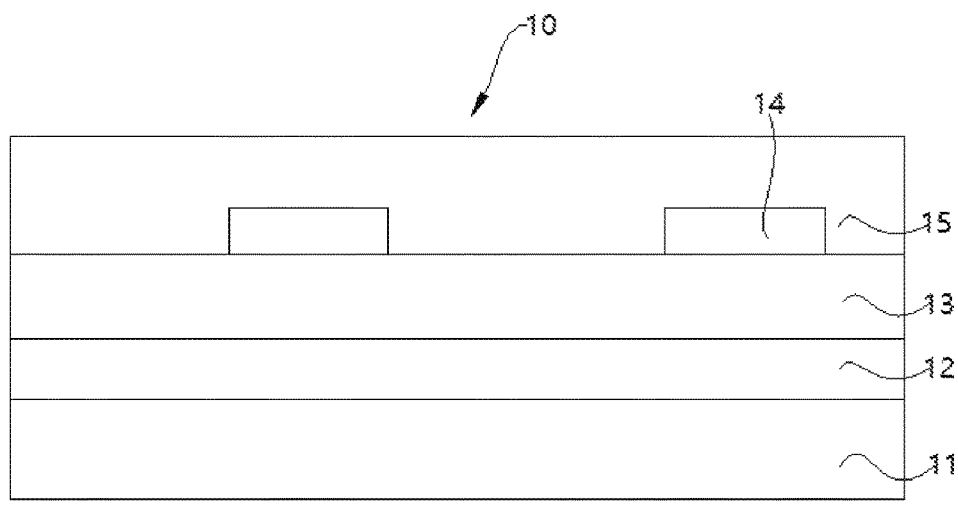
FIGS. 2A, 2B, 2C and 2D are schematic views of the method for repairing the disconnecting signal line of the TFT array substrate of FIG. 1 of the present disclosure.
Figure 2B:
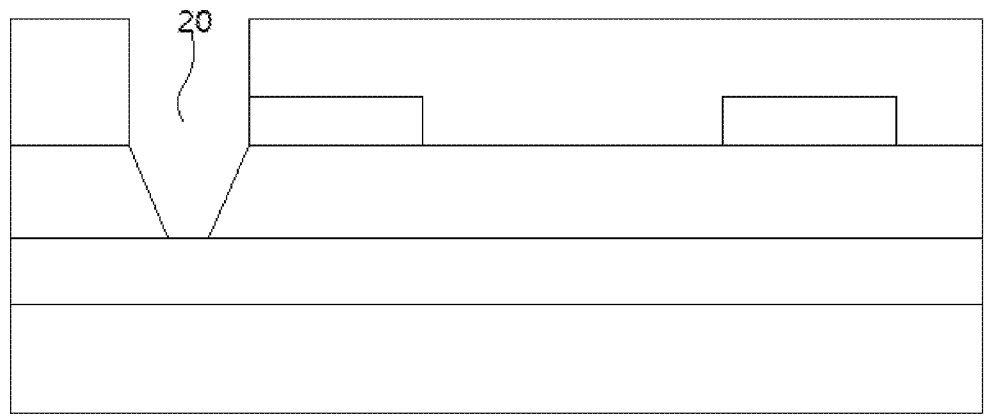

Referring to FIG. 1, a method for repairing a disconnecting signal line of a TFT array substrate is provided, the method including:

S10, Referring to FIG. 2A, a TFT array substrate 10 is provided. The TFT array substrate 10 includes a disconnecting signal line 12. The TFT array substrate 10 includes a base 11, a plurality of signal lines 12 formed on the base 11, a first insulating layer 13 covering the base 11 and the signal lines 12, a plurality of repairing lines 14 formed on the first insulating layer 13, and a second insulating layer 15 covering the first insulating layer 13 and the repairing line 14.

The step S10 further includes:

Firstly, a base 11 is provided. The signal lines 12 are formed on the base 11. The signal lines 12 are made of one or a combination of molybdenum and aluminum. The signal lines 12 include a plurality of data lines and a plurality of gate electrode lines. The data lines and the gate electrode lines are arranged in parallel and spaced from each other. The data lines and the gate electrode lines are vertically intersected in space to form a plurality of sub-pixel areas.

Secondly, a first insulating layer 12 is formed on and covers the base 11 and the signal lines 12. The first insulating layer 13 is made of one or a combination of silicon oxide or silicon nitride. Then, the repairing lines 14 are formed on a surface of the first insulating layer 13. The repairing lines 14 are made of tungsten or molydenum. Finally, a second insulating layer 15 is formed on and covers the first insulating layer 13 and the repairing layer 14. The second insulating layer 15 and the first insulating layer 13 are made by a same material. A thickness of the second insulating layer 15 is greater than a thickness of the first insulating layer 13, shown as FIG. 2A.

S20, a through hole 20 is defined in the first insulating layer 13 placed at an edge of an overlapping area of the repairing line 14 and the disconnecting signal line 12.

The step S20 further includes:

After one signal line 12 is disconnected, the first insulating layer 13 placed at an edge of an overlapping area of the repairing line 14 and the signal line 12 are melted by a laser to define the through hole 20. The through hole 20 passes through the second insulating layer 15 and the first insulating layer 13 and ends at the disconnecting signal line 12. The disconnecting signal line 12 is exposed at the through hole 20.

S30: ink is printed in the through hole 20 by an inkjet printing. The ink completely covers the through hole 20. The ink includes a plurality of metal nanoparticles.

Figure 2C:
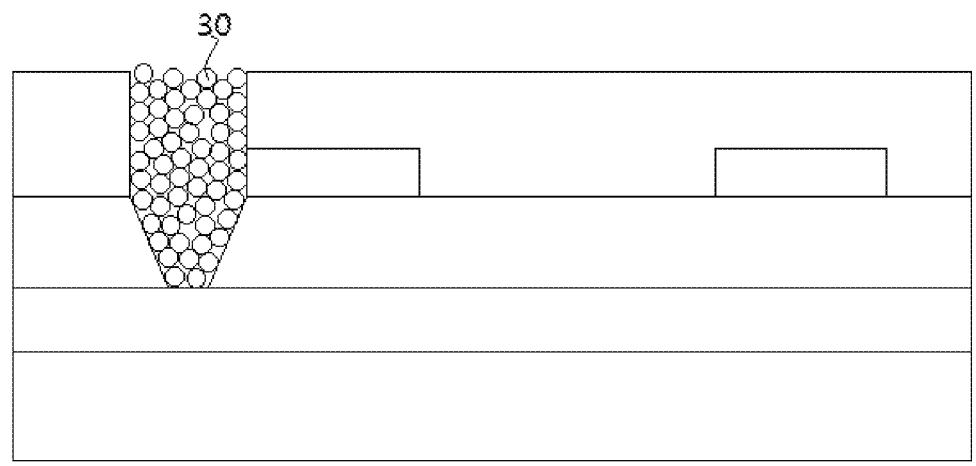
Figure 2D:
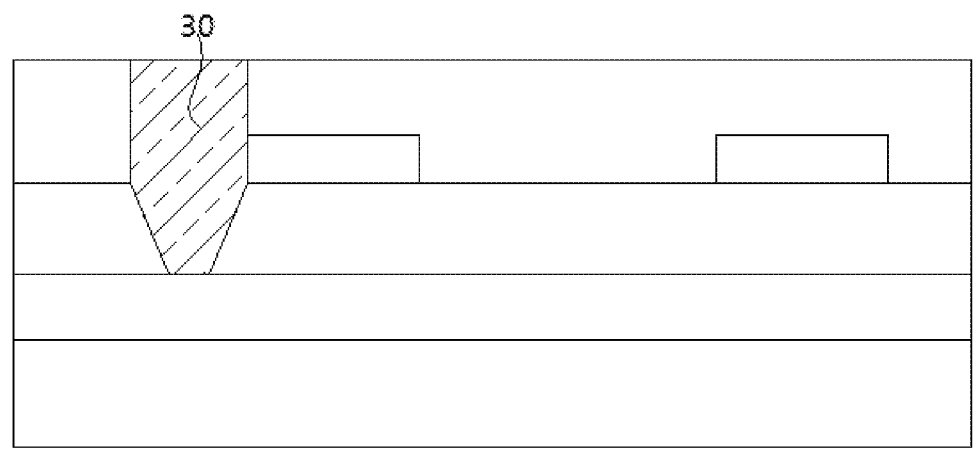

The step S30 further includes:

The ink is printed in the through hole 20 by an inkjet printing and completely fills into the through hole 20. The ink contains the metal nanoparticles with a good conductivity. The metal nanoparticles are made of silver, shown as FIG. 2C.

S40: the ink is cured to make the repairing line and the disconnecting signal line to be connected.

The step S40 further includes:

The ink filling into the through hole 20 is cured by a heating process to solidify the metal nanoparticles. Because the cured metal nanoparticles have a good conductivity, the repairing line 14 and the disconnecting signal line 12 are better connected.

The benefit of the present application is: in the method for repairing the disconnecting signal line of the TFT array substrate, the insulating layer placed at edge of the disconnecting signal lines is melted, and filled with the solidified metal nanoparticles to realize a connection between the disconnecting signal line and the repairing lines and to improve a repairing effect of the disconnecting signal line and to improve a repairing yield.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A method for repairing a disconnecting signal line of a thin film transistor (TFT) array substrate, wherein comprises:
   a step S10 of providing a TFT array substrate, wherein the TFT array substrate comprises a disconnecting signal line, the TFT array substrate comprises a base, a plurality of signal lines formed on the base, a first insulating layer covering the base and the signal lines, a plurality of repairing lines formed on the first insulating layer, and a second insulating layer covering the first insulating layer and the repairing lines;
   a step S20 of defining a through hole in the first insulating layer placed at an edge of an overlapping area of one of the repairing lines and the disconnecting signal line;
   a step S30 of printing ink in the through hole by an inkjet printing, wherein the ink completely covers the through hole, the ink comprises a plurality of metal nanoparticles; and
   a step S40 of curing the ink to make the repairing line and the disconnecting signal line to be connected.

2. The method for repairing the disconnecting signal line of the TFT array substrate of claim 1, wherein in the step S20, the through hole is defined by a laser drilling process.

3. The method for repairing the disconnecting signal line of the TFT array substrate of claim 2, wherein the through hole passes through the second insulating layer and the first insulating layer and ends at the disconnecting signal line.

4. The method for repairing the disconnecting signal line of the TFT array substrate of claim 1, wherein in the step S30, the metal nanoparticles are made of silver.

5. The method for repairing the disconnecting signal line of the TFT array substrate of claim 1, wherein the step S40, the metal nanoparticles are heated in the curing process.

6. The method for repairing the disconnecting signal line of the TFT array substrate of claim 1, wherein in the step S10, the repairing lines are made of tungsten or molybdenum.

7. The method for repairing the disconnecting signal line of the TFT array substrate of claim 1, wherein the first insulating layer is made of one or a combination of silicon oxide and silicon nitride, the second insulating layer and the first insulating layer are made by a same material.

8. The method for repairing the disconnecting signal line of the TFT array substrate of claim 7, wherein a thickness of the second insulating layer is greater than a thickness of the first insulating layer.

9. The method for repairing the disconnecting signal line of the TFT array substrate of claim 1, wherein the signal lines are made of one or a combination of molybdenum and aluminum.

10. The method for repairing the disconnecting signal line of the TFT array substrate of claim 1, wherein the signal lines comprise a plurality of data lines and a plurality of gate electrode lines.

* * * * *